(12) United States Patent
Shim et al.

(10) Patent No.: US 8,258,804 B2
(45) Date of Patent: Sep. 4, 2012

(54) TEST TRAY FOR TEST HANDLER

(75) Inventors: Jae-Gyun Shim, Suwon-si (KR);
Yun-Sung Na, Cheunan-si (KR); In-Gu Jeon, Suwon-si (KR); Tae-Hung Ku, Suwon-si (KR); Jung-Woo Hwang, Hwaseong-si (KR)

(73) Assignee: TechWing., Co. Ltd, Hwaseung-si (KR)

( * ) Notice: Subject to any disclaimer, the term of this patent is extended or adjusted under 35 U.S.C. 154(b) by 435 days.

(21) Appl. No.: 12/513,039

(22) PCT Filed: Oct. 22, 2007

(86) PCT No.: PCT/KR2007/005181
§ 371 (c)(1),
(2), (4) Date: Apr. 30, 2009

(87) PCT Pub. No.: WO2008/054084
PCT Pub. Date: May 8, 2008

(65) Prior Publication Data
US 2010/0001739 A1    Jan. 7, 2010

(30) Foreign Application Priority Data
Nov. 2, 2006  (KR) .................. 10-2006-0107949

(51) Int. Cl.
*G01R 31/00*  (2006.01)

(52) U.S. Cl. ......... 324/756.02; 324/756.07; 324/757.04; 324/762.02; 206/722; 414/225.01

(58) Field of Classification Search ............ 324/756.02, 324/756.07, 757.04, 762.02; 206/722; 414/225.01
See application file for complete search history.

(56) References Cited

U.S. PATENT DOCUMENTS

| | | | | |
|---|---|---|---|---|
| 5,103,976 A | * | 4/1992 | Murphy | 206/719 |
| 5,131,535 A | * | 7/1992 | O'Connor et al. | 206/722 |
| 7,578,046 B2 | * | 8/2009 | Vigil et al. | 29/564 |
| 2005/0012498 A1 | * | 1/2005 | Lee et al. | 324/158.1 |
| 2007/0296419 A1 | * | 12/2007 | Aizawa et al. | 324/537 |

FOREIGN PATENT DOCUMENTS

| | | |
|---|---|---|
| JP | 2005-037394 A | 2/2005 |
| KR | 10-2005-0118885 A | 12/2005 |
| KR | 10-2006-0096641 A | 9/2006 |

* cited by examiner

*Primary Examiner* — Arleen M Vazquez
(74) *Attorney, Agent, or Firm* — Jefferson IP Law, LLP

(57) ABSTRACT

A test tray for a test handler is disclosed that is loaded with semiconductor devices and then carries them along a predetermined circulation route. The test tray allows one fixing unit to fix a plurality of adjacent insert modules to the receiving spaces of the frame, thereby efficiently using the space of the frame and allowing a relatively large number of insert modules to be installed in the same area, in comparison to the conventional test tray.

7 Claims, 3 Drawing Sheets

[Fig. 1]
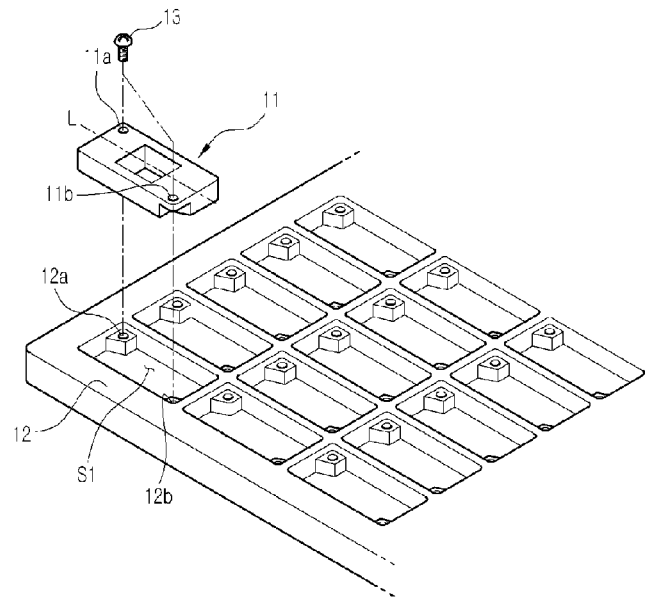
[Fig. 2]
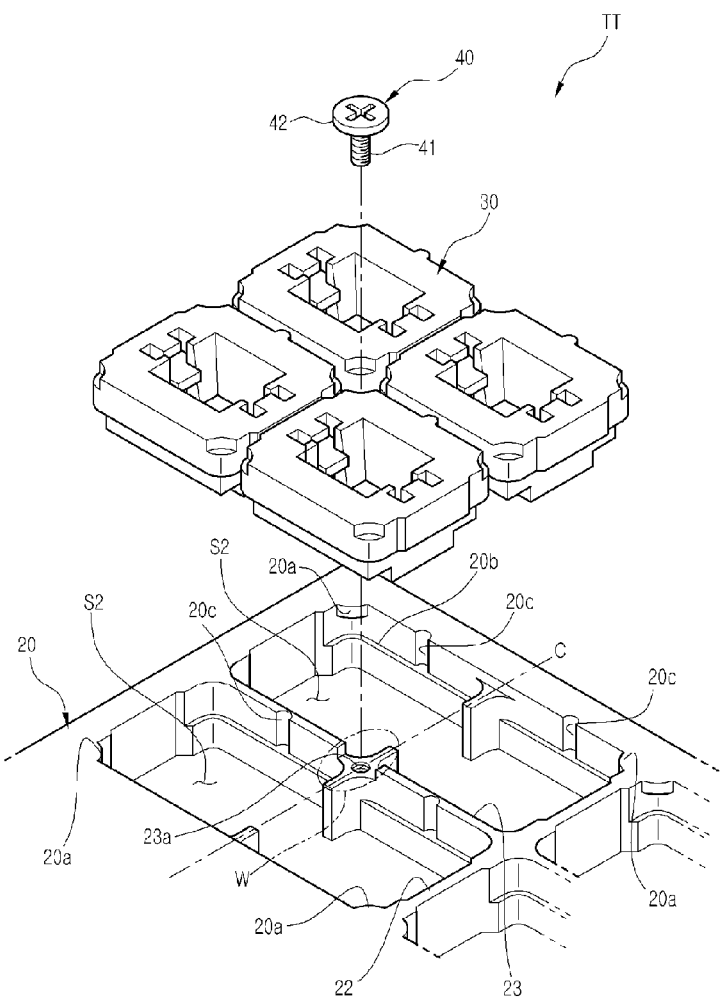

[Fig. 3]
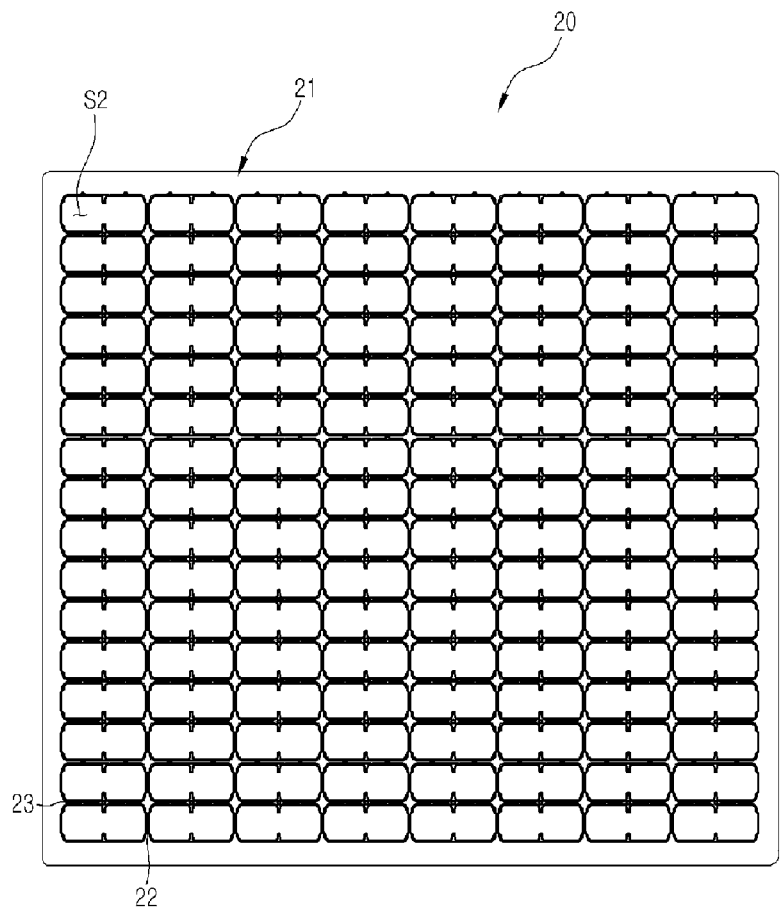
[Fig. 4]
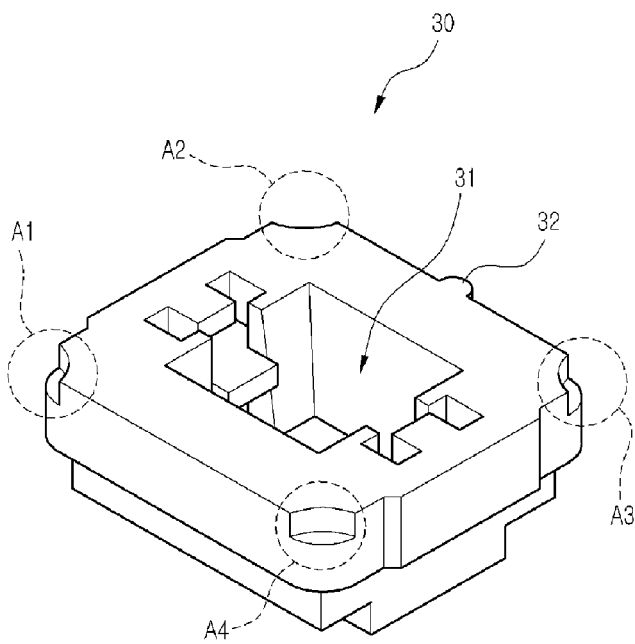

[Fig. 5]
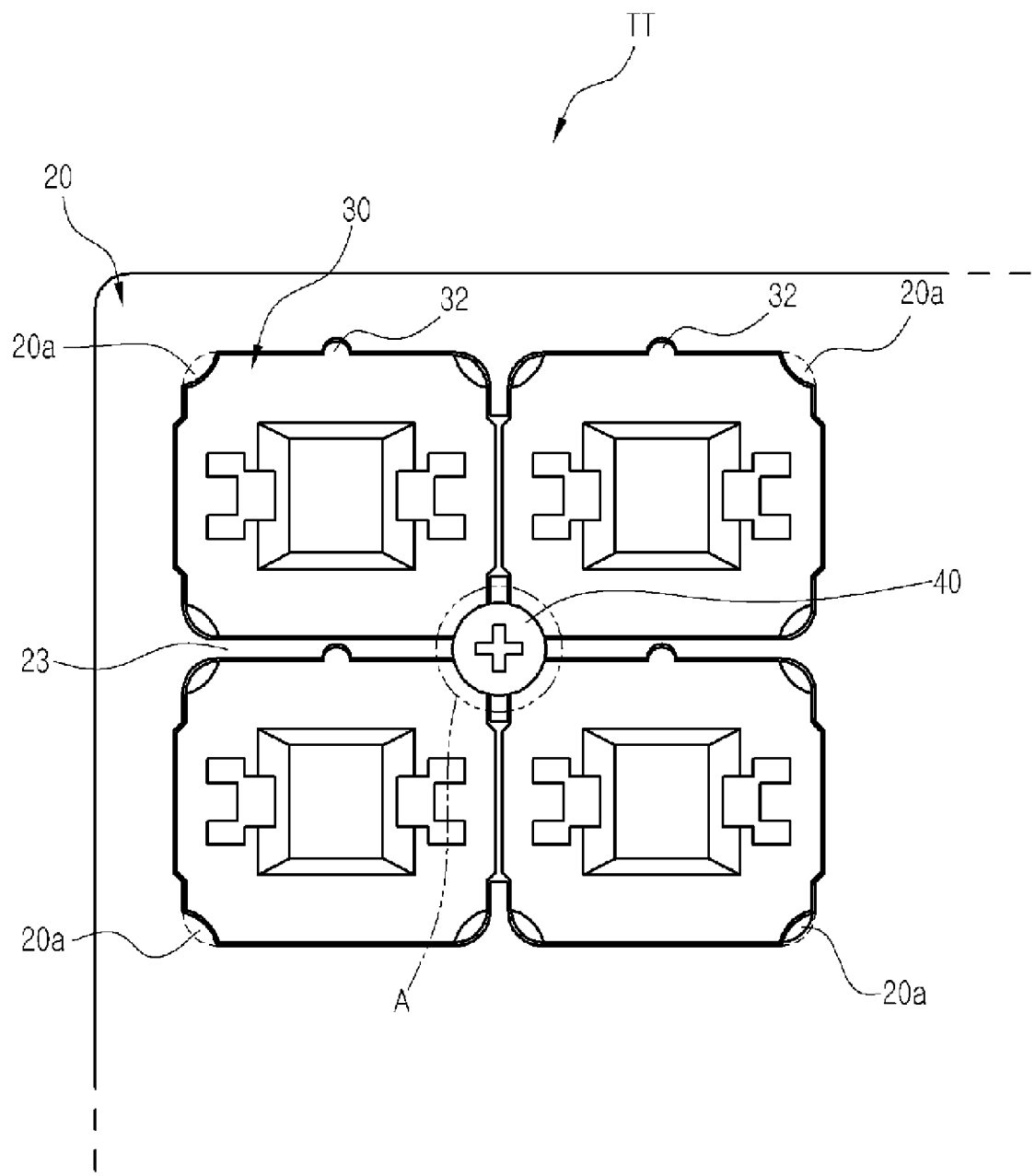

TEST TRAY FOR TEST HANDLER

TECHNICAL FIELD

The present invention relates to a test handler, and more particularly, to a test tray which is loaded with semiconductor devices and then carries them along a predetermined circulation route in a test handler.

BACKGROUND ART

In the field of semiconductor equipment, a test handler, also called automatic test equipment, allows a tester to test semiconductor devices according to predetermined test processes and sorts the tested semiconductor devices, thereby forwarding good quality semiconductor devices. The test handler is configured to include a plurality of test trays which are loaded with semiconductor devices and move in a predetermined cycle therein. While the test trays are moving on the cycling route, they dock with the tester such that the tester can test the semiconductor devices.

Each test tray is configured to include a frame and insert modules which are arrayed on the frame in a matrix form and loaded with semiconductor devices. Function, structure, and form of the test tray are disclosed on Korean Patent Publication No. 10-2002-0030552 and Korean Utility Model Registration No. 20-0389824, which are hereinafter referred to as a conventional art.

FIG. 1 is an exploded perspective view illustrating an insert module and a frame according to a conventional test tray for a test handler. The insert module 11 shaped as a rectangle forms fixing holes 11a and 11b on both ends with respect to the lengthwise axis L. The frame 12 forms receiving spaces S1 on each of which the insert module 11 is placed, and internal thread holes 12a and 12b at the diagonal corners of each receiving space S1, whose locations correspond to those of the fixing holes 11a and 11b of the insert module 11. Each insert module 11 is placed on the receiving space S1 and fixed to the frame 12 as screws 13 are extended through the fixing holes 11a and 11b and screwed into the internal thread holes 12a and 12b.

DISCLOSURE OF INVENTION

Technical Problem

Recently, with increment in the use of and demand for semiconductor devices, semiconductor devices must be rapidly tested, and accordingly testers must be able to test a relatively large number of semiconductor devices at one time. However, since the conventional test tray is constructed in such a way that the insert module is fixed its both ends in the lengthwise direction to the frame by the screws, it has a structural disadvantage in that much space for the corresponding fixing structure should be consumed.

Also, since the conventional test tray uses two fixing units (for example, screws) to install one insert module to the frame, it causes to increase the number of parts and the working hours.

Technical Solution

Therefore, the present invention has been made in view of the above problems, and it is an object of the present invention to provide a test tray for a test handler that can fix a plurality of adjacent insert modules to the frame of the test tray using one fixing unit.

It is another object of the present invention to provide a test tray for a test handler that has a structure that at least two points of an insert module should be fixed to the frame of the test tray, in which one point of the insert module is fixed to the frame by a fixing unit and other points are structurally coupled and fixed to the frame.

It is another object of the present invention to provide a test tray for a test handler that can properly guide and place insert modules on the frame of the test tray.

In accordance with an aspect of the present invention, the above and other objects can be accomplished by the provision of a test tray for a test handler including: a frame forming receiving spaces arrayed in a matrix form; a multiplicity of insert modules received in the receiving spaces, respectively; and a plurality of fixing units each of which fixes two or more insert modules to the frame. Here, the frame forms separation-preventing protrusions each of which prevents a position of the insert module from separating, in which the position is spaced apart from the portion where the two or more insert modules are adjacent, at a certain distance.

Preferably, the frame further forms a plurality of internal thread holes each of which is placed at a location where the two or more insert modules are adjacent. The fixing unit comprises an external thread portion screwed into the internal thread hole and a screw head whose diameter is greater than that of the external thread portion. Here, the screw head has a diameter to cover a part of the portion where the two or more insert modules are adjacent.

Preferably, the frame has a plurality of extended widths on which the plurality of internal thread holes is formed, respectively.

Preferably, the fixing unit fixes four adjacent insert modules arrayed in a 2×2 matrix form to the frame.

Preferably, each receiving space receives two adjacent insert modules.

Preferably, the frame further forms a multiplicity of guide grooves for safely guiding the insert modules, and each insert module forms a guide protrusion guided along the guide groove.

In accordance with another aspect of the present invention, there is provided a test tray for a test handler including: a frame forming receiving spaces arrayed in a matrix form; a multiplicity of insert modules received in the receiving spaces, respectively; and a plurality of fixing units each of which fixes a first portion of the insert module to the frame. Here, the frame or/and the insert modules has/have a separation-preventing structure to prevent a second portion of the insert modules from separating, in which the second portion is spaced apart from the first portion at a certain distance.

Preferably, the separation-preventing structure includes a separation-preventing protrusion formed in the frame to prevent the second portion of the insert module from separating.

Preferably, the first and second portions are diagonally placed at the corners of the insert module.

In accordance with another aspect of the present invention, there is provided a test tray for a test handler including: a frame forming receiving spaces arrayed in a matrix form; a multiplicity of insert modules received in the receiving spaces, respectively; and a plurality of fixing units for fixing the multiplicity of insert modules to the frame. Here, the frame or/and the insert modules has/have a guide structure to safely and carefully guide the insert modules.

Preferably, the guide structure includes: guide grooves formed in the frame, for safely guiding the insert modules; and guide protrusions formed in the insert modules, for being guided along the guide grooves.

Advantageous Effects

As apparent from the above description, the test tray for a test handler according to the present invention has advantages as follows.

Since a multiplicity of adjacent insert modules are fixed to the frame by one fixing unit, the test tray can save space for installing the insert modules to the receiving spaces and accordingly can be loaded with a relatively large number of insert modules in the same area, in comparison with the conventional test tray.

Also, since only one point of the insert module is fixed to the frame by a fixing unit and other points are structurally coupled and fixed to the frame, the test tray can reduce its number of parts and enhance its production efficiency.

Furthermore, since the insert module is safely installed to the receiving space of the frame through guide structures, such as a guide protrusion and a guide groove, the test tray allows the operator to easily and efficiently perform the assembling process and enhance its production efficiency.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

BRIEF DESCRIPTION OF THE DRAWINGS

The above and other objects, features, and other advantages of the present invention will be more clearly understood from the following detailed description taken in conjunction with the accompanying drawings, in which:

FIG. 1 is an exploded perspective view illustrating an insert module and a frame according to a conventional test tray for a test handler;

FIG. 2 is an exploded perspective view illustrating a part of a test tray for a test handler according to an embodiment of the present invention;

FIG. 3 is a plan view illustrating a frame adapted to the test tray of FIG. 2;

FIG. 4 is a perspective view illustrating an insert module adapted to the test tray of FIG. 2; and FIG. 5 is a partially enlarged plan view illustrating a state where insert modules are received in the frame of the test tray of FIG. 2.

BEST MODE FOR CARRYING OUT THE INVENTION

Preferred embodiments according to a test tray for a test handler of the present invention will be described in detail with reference to the accompanying drawings.

FIG. 2 is an exploded perspective view illustrating a part of a test tray for a test handler according to an embodiment of the present invention.

Referring to FIG. 2, the test tray TT is configured to comprise a frame 20, a multiplicity of insert modules 30, and screws 40.

As entirely shown in FIG. 3, the frame 20 comprises: an outer body 21 which is shaped as a rectangle, defining the periphery of the frame 20; lengthwise intermediate beams 22 which are spaced apart in the widthwise direction at a certain interval and coupled to the outer body 21 in the lengthwise direction; and widthwise intermediate beams 23 which are spaced apart in the lengthwise direction at a predetermined interval and coupled to the outer body 21 in the widthwise direction. It should be understood that the outer body 21, lengthwise intermediate beams 22, and widthwise intermediate beams 23 of the frame 20 are named as such for convenient description. According to embodiments of the present invention, the outer body 21, lengthwise intermediate beams 22, and widthwise intermediate beams 23 are integrally formed as the frame 20, or separately formed and then assembled to become the frame 20. The frame 20 is formed like a lattice by the outer body 21, lengthwise intermediate beams 22, and widthwise intermediate beams 23. As a result, the frame 20 forms receiving spaces S2 arrayed in a matrix form, on which the insert modules 30 are placed.

As shown in FIG. 3, the frame 20 has receiving spaces S2 in the 16×8 matrix form. Each receiving space S2 is shaped as a rectangle where its width is approximately twice its length and receives two insert modules 30 in parallel in the widthwise direction of the frame 20, as shown in FIG. 2.

Referring to FIG. 2, the widthwise intermediate beam 23 between two adjacent receiving spaces S2 is formed in such a way that its width is protrudently extended to the both sides at the portion where the widthwise intermediate beam 23 meets the center line C bisecting the widths of the respective receiving spaces S2. Therefore, each receiving space S2 is composed of two sub-receiving spaces between whose adjacent wall is partially opened. And, an internal thread hole 23a is formed vertically at the protrudently extended portion w. The widthwise intermediate beam 23 is formed in such a way to reduce its thickness, in comparison to a conventional beam, but only to widen the thickness of the portion for fixing of the insert modules 30. Therefore, the frame 20 according to the present invention can use its space efficiently and allows the insert modules 30 to be properly fixed thereto. As a result, one internal thread hole 23a is located at the center of two parallel receiving spaces S2 and fixes two pairs of insert modules 30 (four insert modules) arrayed in parallel to the receiving spaces S2 to the frame 20.

Also, at the corners of the frame 20 diagonally located with respect to the internal thread hole 23a, separation-preventing protrusions 20a are formed to prevent the corners of the insert modules 30 from separating upwardly when edge of the insert modules 30 is placed at the hanging protrusions 20b.

In addition, the frame 20 forms guide grooves 20c, which will be described in detail later.

FIG. 4 is a perspective view illustrating one of insert modules 30 of FIG. 2. The insert module 30 is shaped as approximately square in plan view. The insert module 30 forms a receiving portion 31 that receives one semiconductor device. Also, the insert module 30 forms four steps A1, A2, A3, and A4 at its corners, respectively, in which a corresponding step is fixed by a separation-preventing protrusion 20a of the frame 20 to prevent the insert module 30 from separating upwardly. Also, the upper surface of the insert module 30 is approximately at the same level as that of the frame 20. Here, the steps A1, A2, A3, and A4 of the insert module 30 are formed in such a way to correspond to the separation-preventing protrusion 20a of the frame 20, so that a corresponding step is structurally coupled to the separation-preventing protrusion 20a without the use of any additional fixing unit to place the insert module 30 in the frame 20. Specifically, such a separation-preventing structure, which includes the separation-prevention protrusion 20a and the steps A1 to A4, is formed at a second portion which is spaced apart from a first portion fixed by the screw 40 at a certain distance. So, at two or more points of insert module 30 are fixed at frame 20. In particular, to fix the insert module 30 reliably, it is mostly preferable to form the first portion which is fixed by the screw 40 and the second portion which is fixed by the separation-preventing structure are diagonally placed.

Each insert module 30 according to the present invention has a guide protrusion 32 at its one side wall in the middle, which corresponds to the guide groove 20c of the frame 20. The guide protrusion 32 is slidably coupled to the guide groove 20c to safely guide the insert module 30 into the receiving space S2. Generally, wrong installment is not considered in the conventional insert module 11, because the insert module 11 is shaped as rectangular and in point symmetry. However, since the insert module 30 according to the present invention is formed as square thereby wrong installment could occur, the guide protrusion 32 and guide groove 20c are needed for guide structure to prevent wrong installment. Although the guide structure is realized in the embodiment of the present invention because the insert module 30 is square, it should be understood that the guide structure would be formed in the case that the insert module should be safely and carefully installed, such as a rectangular and non-point-symmetrical insert module.

The screw 40 which is provided as a fixing unit as shown in FIG. 2 is screwed into the internal thread hole 23a, to fix four insert modules 30 to the frame 20, i.e., the widthwise intermediate beam 23. The screw 40 is composed of an external thread portion 41 for coupling with the internal thread hole 23a and a screw head 42 whose diameter is greater than that of the external thread portion 41.

The following is a description of the assembling processes of the test tray TT and of the functions of the constitutional elements referring to FIG. 5. FIG. 5 is a partially enlarged plan view depicting a state where insert modules of FIG. 2 are received in the frame.

An operator (or an automatic machine) places four insert modules 30 in the two receiving spaces S2, arrayed side by side in the lengthwise direction, in 2×2 matrix form. In this case, each guide protrusion 32 of the four insert modules 30 is guided along the guide groove 20c of the frame 20 and edges of the four insert modules 30 are coupled to the separation-preventing protrusions 20a, respectively, at the corners of the square defined by the four insert modules 30 (or the adjacent two pairs of insert modules 30). That is, the separation-preventing protrusions 20a, coupled to the edges (steps) of the four insert modules 30, are located at positions in the diagonal direction from a portion A (the center of the square) where the four insert modules 30 are adjacent together.

After placing the four insert modules 30 in the receiving spaces S2, the screw 40 is screwed into the internal thread hole 23a formed on the protrudently extended portion w of the widthwise intermediate beam 23 of the frame 20, i.e., at the portion A. Here, a diameter of the screw head 42 is expanded to four corners of the adjacent insert modules 30. So, the screw head 42 of the screw 40 covers the four corners of the insert modules 30, which are positioned at the portion A. Therefore, each insert module 30 is fixed to the frame in such a way that its one corner is prevented from separating by the screw head 42 and the opposite edge, located in diagonal direction of the one corner, is prevented from separating by the separation-preventing protrusion 20a. Accordingly, the insert module 30 can be firmly installed to the receiving space S2.

Although the embodiment of the present invention is implemented based on a square insert module, it should be understood that it can be modified based on a rectangular insert module. In addition, although the embodiment of the present invention is implemented in such a way to fix four insert modules by one screw, it should be understood that it can be modified such that one screw fixes only two insert modules to the frame.

INDUSTRIAL APPLICABILITY

The present invention can be properly applied to the field of testing semiconductor devices.

The invention claimed is:

1. A test tray for a test handler comprising:
a frame forming receiving spaces arrayed in a matrix form;
a multiplicity of insert modules received in the receiving spaces, respectively; and
a fixing unit for fixing four adjacent insert modules arrayed in a 2×2 matrix form to the frame,
wherein the frame forms separation-preventing protrusions each of which prevents a position of the insert module from separating, in which the position of each insert module is spaced apart from a portion where the 4 insert modules are adjacent, at a certain distance.

2. The test tray according to claim 1, wherein:
the frame further forms a plurality of internal thread holes each of which is placed at a location where the 4 insert modules are adjacent; and
the fixing unit comprises an external thread portion screwed into the internal thread hole and a screw head whose diameter is greater than that of the external thread portion,
wherein the screw head has a diameter to cover a part of the portion where the 4 insert modules are adjacent.

3. The test tray according to claim 2, wherein the frame has a plurality of extended widths on which the plurality of internal thread holes is formed, respectively.

4. The test tray according to claim 1, wherein each receiving space receives two adjacent insert modules.

5. The test tray according to claim 1, wherein:
the frame further forms a multiplicity of guide grooves for safely guiding the insert modules;
each insert module forms a guide protrusion guided along the guide groove.

6. A test tray for a test handler comprising:
a frame forming receiving spaces arrayed in a matrix form;
a multiplicity of insert modules received in the receiving spaces, respectively; and
a plurality of fixing units each of which fixes a first portion of the insert module to the frame,
wherein the frame or/and the insert modules has/have a separation-preventing structure to prevent a second portion of the insert modules from separating, in which the second portion is spaced apart from the first portion at a certain distance,
wherein the separation-preventing structure comprises a separation-preventing protrusion formed in the frame or/and the insert modules to prevent the second portion of the insert module from separating, and wherein the first and second portions are diagonally placed at the corners of the frame or/and the insert module.

7. A test tray for a test handler comprising:
a frame forming receiving spaces arrayed in a matrix form;
a multiplicity of insert modules received in the receiving spaces, respectively; and
a plurality of fixing units for fixing the multiplicity of insert modules to the frame,
wherein the frame or/and the insert modules has/have a guide structure to safely and carefully guide the insert modules,
wherein the guide structure comprises:
guide grooves formed in the frame, for safely guiding the insert modules, and
guide protrusions formed in the insert modules, for being guided along the guide grooves.

* * * * *